United States Patent [19]
Fuentes et al.

[11] Patent Number: 5,185,056
[45] Date of Patent: Feb. 9, 1993

[54] METHOD AND APPARATUS FOR ETCHING SEMICONDUCTOR WAFERS AND DEVELOPING RESISTS

[75] Inventors: Ricardo I. Fuentes, Hopewell Junction; Inna V. Babich, Chappaqua, both of N.Y.

[73] Assignee: International Business Machines Corporation, Armonk, N.Y.

[21] Appl. No.: 759,277

[22] Filed: Sep. 13, 1991

[51] Int. Cl.⁵ .................. H01L 21/306; B44C 1/22
[52] U.S. Cl. .................................. 156/639; 134/33; 156/640; 156/655; 156/657; 156/659.1; 156/662; 156/345
[58] Field of Search ............... 156/637, 639, 640, 657, 156/655, 659.1, 662, 668, 345; 134/33, 134

[56] References Cited

U.S. PATENT DOCUMENTS

| | | | |
|---|---|---|---|
| 2,568,803 | 9/1951 | Guenst | 156/345 |
| 3,041,225 | 6/1962 | Emeis | 156/7 |
| 3,597,289 | 8/1971 | Kohl et al. | 156/17 |
| 3,674,579 | 7/1972 | Clinehens et al. | 156/5 |
| 3,953,265 | 4/1976 | Hood | 156/8 |
| 4,161,356 | 7/1979 | Giffin et al. | 156/345 X |
| 4,339,297 | 7/1982 | Aigo | 156/345 |
| 4,344,809 | 8/1982 | Wensink | 156/345 |
| 4,350,562 | 9/1982 | Bonu | 156/345 X |
| 4,544,446 | 10/1985 | Cady | 156/639 |
| 5,001,084 | 3/1991 | Kawai et al. | 134/33 X |

*Primary Examiner*—William A. Powell
*Attorney, Agent, or Firm*—John J. Goodwin; Robert M. Trepp

[57] ABSTRACT

An apparatus for modifying, such as etching or developing, selected areas of a wafer is disclosed including a rotatable turntable upon which a wafer having a surface to be etched is mounted. A delivery nozzle for directing modifying fluid onto the wafer surface is disposed over the wafer surface at a first location. At least one structure for removing the modifying fluid, such as a vacuum nozzle is positioned over the surface of the wafer at a second location. The modifying fluid moves across the wafer surface by centrifugal force away from the first location and is removed at the second location. The surface area of the wafer between the first and second locations is modified by the etching fluid.

13 Claims, 1 Drawing Sheet

METHOD AND APPARATUS FOR ETCHING SEMICONDUCTOR WAFERS AND DEVELOPING RESISTS

BACKGROUND OF THE INVENTION

1. Field of the Invention

The present invention relates to method and apparatus for etching a semiconductor substrate and more particularly to a method and apparatus for etching a semiconductor substrate wherein etching fluid is moved across selected areas of the substrate by dynamic force.

2. Description of the Prior Art

U.S. Pat. No. 3,041,225 issued Jun. 26, 1932 to Emeis and entitled METHOD AND APPARATUS FOR SURFACE TREATMENT OF P-N JUNCTION SEMICONDUCTORS, describes a structure which utilizes centrifugal force for increasing the flow velocity of the etching liquid by rotating a wafer member during processing about an axis normal to the surface being etched. During rotation, the etching liquid, supplied in form of a free jet, is flung outwardly by centrifugal force.

A nozzle shaped tube is positioned above a rotating disc containing a wafer. An etching liquid is thereby directed onto the wafer. Centrifugal force is imposed upon the etching fluid by the rotation of the disc.

U.S. Pat. No. 3,597,289, issued Aug. 3, 1971 to Kohl et al and entitled METHOD OF ETCHING A SEMICONDUCTOR BODY, describes a structure wherein a wafer is etched by applying a stream of etching fluid from a nozzle while the wafer is rotated under the nozzle. The etching fluid does not flow due to centrifugal force in this structure.

U.S. Pat. No. 3,674,579, issued Jul. 4, 1972 to Clinehens et al entitled METHOD OF FORMING ELECTRICAL CONDUCTORS, relates to a method of forming electrical conductors to selected regions of a semiconductor wafer. An aluminum film of approximately 10,000 angstroms is evaporated upon a silicon dioxide insulative evaporation mask which has been formed on a silicon wafer. A conductor mask is formed upon selected areas of the aluminum film. The masked aluminum film is placed upon a spinner. Phosphoric acid is continuously poured near the center of the masked metal film. The masked aluminum film is spun for a period of approximately four minutes, to remove the portions of the aluminum film which are not coated by the conductor mask, in order to form electrical conductors in contact with selected regions of the silicon wafer.

U.S. Pat. No. 3,953,265, issued Apr. 27, 1976 to Hood entitled MENISCUS-CONTAINED METHOD OF HANDLING FLUIDS IN THE MANUFACTURE OF SEMICONDUCTOR WAFERS, relates to a method for reducing the consumption of etchants used in manufacturing semiconductor devices comprising the steps of supporting a semiconductor wafer, metering a predetermined volume of etchant onto the surface of said wafer to form a meniscus-contained body of etchant thereon, maintaining said wafer static during etching, sensing the completion of said etching, and spinning said wafer upon completion of the etching to remove the etchant from the wafer and terminate the etching operation.

U.S. Pat. No. 4,339,297, issued Jul. 13, 1982 to Aigo entitled APPARATUS FOR ETCHING OF OXIDE FILM ON SEMICONDUCTOR WAFER, discloses an apparatus for applying photo-etching on one surface of a semiconductor wafer formed with oxide film is provided, which comprises a cup-shaped basin having at the bottom thereof a vertical passage for introducing etching liquid, and a chuck rotatably supported above said basin for vacuum-absorbing a semiconductor wafer at the bottom surface thereof, said one surface of wafer facing downward being contacted with etching liquid that is blown up vertically through said vertical passage of the basin, to thereby prevent the upward facing rear surface of wafer from being contacted with etching liquid to hold oxide film thereon, and means for rotating said chuck to remove any reaction gas resulted on said one surface of wafer.

U.S. Pat. No. 4,544,446, issued Oct. 1, 1985 to Cady entitled VLSI CHEMICAL REACTOR, discloses a VLSI chemical reactor that includes a fluid flow guide spaced from the corresponding substrate in the form of a wafer for significantly reducing contamination in the processing of semiconductor wafers. Processing chemicals are introduced in a continuous process through a central tube and through the fluid flow guide which is substantially planar and which is parallel to the surface of the wafer. A predetermined gap is maintained between the guide and the wafer such that fluid is maintained in the gap at all times critical in the processing of the wafer.

SUMMARY OF THE INVENTION

An object of the present invention is to provide a system for etching a wafer surface or developing a resist on a wafer surface wherein the etchant or developer is applied to the surface of the wafer or the resist in a liquid pool over the area to be etched or developed by means of a delivery nozzle and the wafer is mounted on a rotating turntable where a vacuum nozzle is disposed at the circumference of the etchant pool or developer.

Another object of the invention is to provide a method for the described system wherein as the turntable is rotated, the etchant or developer removes or develops the wafer region or the resist region on the wafer and centrifugal force causes the etchant or developer to move to the vacuum nozzle where it is continually removed.

A further object of the present invention is to provide a system and method as disclosed in which the vacuum nozzle is disposed on the end of a radial arm attached to a radial position and wherein the desired diameter of the etch is controlled by the position of the arm.

DESCRIPTION OF THE PREFERRED EMBODIMENT

Membranes on silicon wafers are widely used, for example, as masks in X-ray lithography systems. In order to back-etch silicon wafers to fabricate a membrane out of the material grown, deposited or diffused-in on the front side of the wafer, the membrane material has to withstand the etchant or it has to be protected from it. Also, a suitable resist (organic or inorganic) has to be deposited, and it has to adhere throughout the whole process to the back of the wafer, to protect the backside from etching. Alternatively, the wafer would have to be held in an appropriate fixture to provide similar protection. Or, the back side protection would have to be built-in, as is the case of B-doped Si. Furthermore, the wafer has to be able to withstand planar etching (i.e., etching of the whole defined section all at once until the membrane if formed all at the same time) and the membrane has to be able to withstand all of the above and the associated process steps to deposit and remove the resist, etc.

Unfortunately, in some cases, it is very difficult to get a resist/etching system that will be compatible with the growth process and/or the deposited film itself. Adhesion of the resist to the back of wafers may be impeded by previous growth steps, as is the case of the SiC on Si structure.

Also, wafers that are found to be under stress may not withstand a planar etch process. Conventional bath etching will result in the destruction of such samples.

The present invention provides improved apparatus and method for producing a membrane. The method and apparatus are gentle enough as to also provide some relief in cases when the membrane material is very thin or fragile, as compared with conventional planar etch processes. Typically, such processes also require additional steps for resist application, patterning, removal, and cleaning of the membrane. The absence of the need for such additional steps results in increased ease of use, versatility and sample yield.

The method of the present invention consists of a succession of radial etch steps. Beginning, typically, at the center of the sample, an etch well is expanded radially outwards keeping a steep slope on the well walls. Alternatively, for samples where catastrophic stress relief is not a problem, the area to be etched can be defined and etched all at once. The etchant is added to the center of the sample and suctioned around the periphery of the well.

Any suitable etchant can be used with this method, specially advantageous are fast etchants. Strong mixtures of hydrofluoric, nitric and acetic (or water) are particularly useful for silicon, however, different etchants or mixtures thereof can be used for different stages of the etching process (i.e., bulk etching vs. edge finishing).

Figure 1:
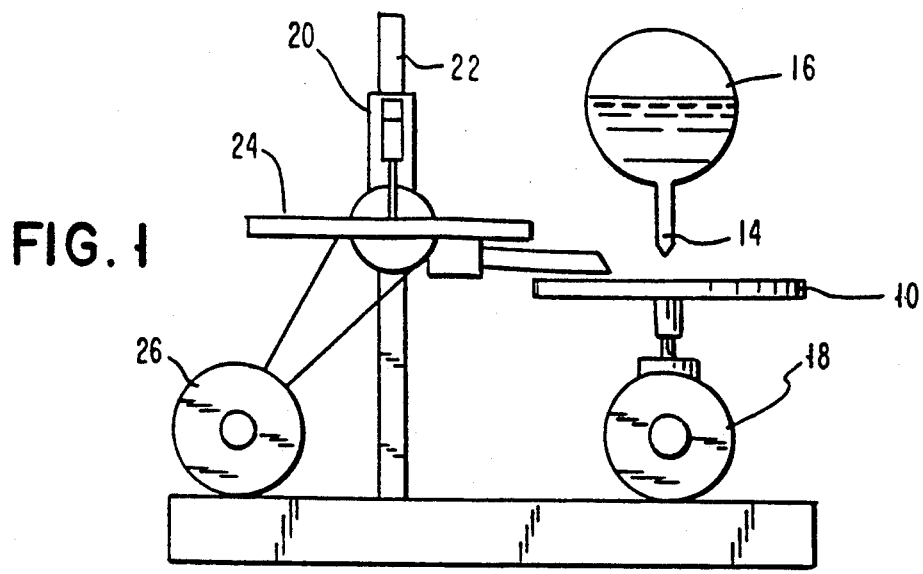
FIG. 1 is a schematic illustration of an embodiment of an etching system for semiconductor wafers.

To carry out the method, the structure illustrated in FIG. 1 is employed. Referring to FIG. 1, the structure includes a turntable 10, movable arm 12, etchant delivery nozzle 14, reservoir (or pump) 16 and sensors.

Turntable 10 is driven rotationally by motor 18. Movable suction arm 12 can be raised or lowered in the Z direction by a motor driven vertical positioner 20 mounted on support 22. Suction arm 12 can also be positioned at points from the center of turntable 10 radially outward to the circumference of turntable 10 by a radial positioner 24 driven by motor 26.

A wafer is placed on the turntable 10. Etchant is delivered onto the wafer by nozzle 14 at an appropriate rate and location. For purposes of explanation, the etchant is delivered at the center of the wafer (the center of rotation). The pool of etchant expands outward due to centrifugal force as it etches the wafer. The suction arm 12 is located at a selected radial distance in accordance with the desired membrane diameter. The suction arm 12 removes the etchant away from the wafer at the desired radial distance such that the remaining portion radially further than suction arm 12 is not etched.

One skilled in the art will appreciate that variations of the structure and operation of FIG. 1 are possible. The nozzle 14 may be moved with respect to the turntable 10, the suction arm 12 may be moved with respect to a fixed turntable 10 location, turntable 10 may be moved with respect to a fixed suction arm 12, or combination of the above. Also, multiple suction arms positioned over the turntable 10 as well as multiple nozzles may also be employed.

The etchant is administered to the sample via the nozzle at an appropriate rate and location. The area to be etched is defined by the position of the movable arm, which suctions the etchant away from the sample. Typically, a small area is etched all the way through the wafer and expanded outwards (by moving the arm) to reach the desired membrane diameter. The rate of expansion determined by the etchant, sample geometry and stress state, among other things.

Other modifications of the system would perform a similar function. Included are the movement of the nozzle with respect to a fixed plate, movement of the table with respect to the arm, or any combination thereof. Multiple suction arms as well as multiple nozzles are also a possibility. Finally, alternate geometries for the different components may also be equally functional.

Excentric, $r-\theta$, or cam-driven mechanisms would further extend the usefulness of this apparatus by enabling areas of arbitrary shape to be etched anywhere in the wafer.

The method and apparatus solve a major problem in back-etching wafers for the fabrication of membranes for X-ray mask applications. It has been shown to be particularly useful in silicon/silicon carbide systems where spurious carbide deposition on the back of the wafers prevents adhesion of protective layers. Even of greater importance is the fact that the system allows the etching of highly stressed wafers, that would be very hard to etch in any other way. Also, the system is ideally suited for small runs and does not require the large volume etching tanks typically needed for bath etching. Etchants can be changed during the process without interruption or without removing the samples. Diamond or diamond-like materials grown on silicon have also greatly benefited from this method of membrane formation.

Since only the area being etched is in contact with the chemical agents, patterned wafers can be etched with this system without the need of any protective steps.

The system can detect the onset of different stages during the etching process by including a variety of sensors in the structure of FIG. 1. Included are initial etch-trough, position and end-point. The process can be totally automated and be made compatible with standard manufacturing interfaces by appropriate use of robotics.

Figure 2:
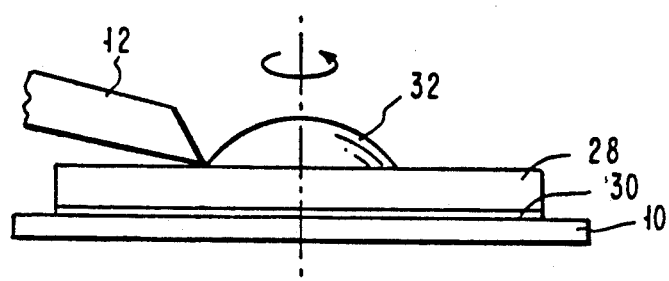
FIGS. 2, 3 and 4 illustrate the use of the apparatus illustrated in FIG. 1 for the fabrication of a membrane.
Figure 3:
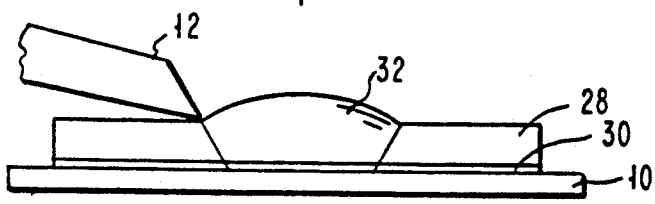
Figure 4:
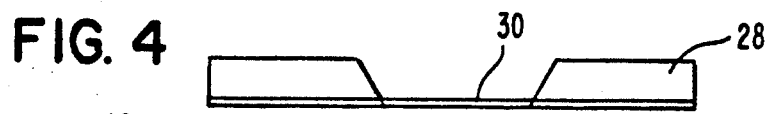

Referring to FIGS. 2, 3 and 4, and application of the structure of FIG. 1 is illustrated. FIG. 2 shows turntable 10 having therein a wafer 28 on the back of which is a deposited film 30 which will become a membrane. A pool of etchant 32 has been delivered by the nozzle shown in FIG. 1, and as turntable 10 rotates the etchant is forced outwardly to the location in FIG. 2 where suction arm 12 is located. Suction arm 12 removes the etchant 32 at this location, such that the wafer 28 is etched at a selected area and diameter as shown in FIG.

3. The etchant removes all the wafer 28 material within the area defined by the nozzle, leaving only the membrane 30 as shown in FIG. 4. The etching depth is detected by known sensors and known techniques, and the etching is terminated as desired.

As previously stated, the described apparatus and method may be used to develop a resist layer on a wafer surface instead of etching the wafer surface.

Figure 5:
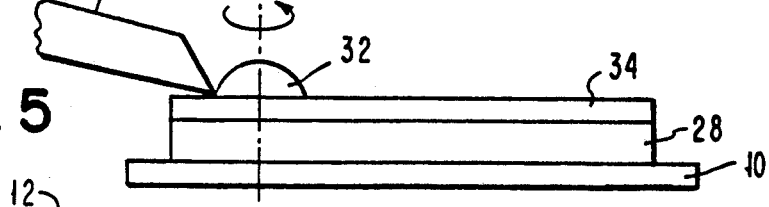
FIGS. 5 and 6 illustrate the use of the apparatus of FIG. 1 for selectively clearing or developing resist.
Figure 6:
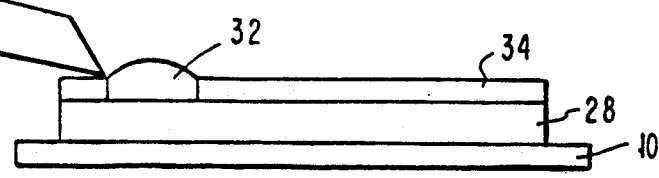

In FIG. 5, a wafer 28 is located on turntable 10 which has a layer of resist 34 on the front side thereof. The turntable 10 is shown having an offset center of rotation. As previously described, the developer is delivered to the desired point, i.e., the center of rotation and nozzle 12 is disposed at the desired diameter distance. As shown in FIG. 6, the etchant selectively clears or develops the resist in a predetermined area.

Having thus described our invention what we claim as new and desire to secure as Letters Patent, is:

1. An apparatus for modifying selected surface areas of a wafer comprising:
   a rotatable means for supporting a wafer of material having a surface to be modified on a vertical axis of rotation,
   means proximate to said rotatably supported wafer for delivering a stream of modifying fluid onto a first position on the surface of said wafer wherein rotation of said wafer causes said modifying fluid delivered thereon to move across the surface of said wafer away from the center of said rotation of said wafer due to centrifugal force,
   means for removing said modifying fluid from a second position on said surface of said wafer, and
   a driving means for translating and positioning said removing means at selected locations relative to said surface of said wafer wherein said wafer surface is modified in an area between said first position where said modifying fluid is delivered onto said surface and said second position where said modifying fluid is removed from said surface.

2. An apparatus according to claim 1 wherein said surface to be modified is the surface of a semiconductor wafer and wherein said modifying fluid is an etching fluid.

3. An apparatus according to claim 1 wherein said surface to be modified is the surface of a layer of photoresist material and wherein said modifying fluid is a photoresist developer.

4. An apparatus for etching according to claim 1 wherein said removing means includes at least one suction nozzle.

5. An apparatus for modifying selected surface areas according to claim 1 wherein said driving means is connected to said means for removing said modifying fluid for positioning said removing means relative to said rotatable means.

6. An apparatus for modifying selected surface areas according to claim 1 wherein said driving means is connected to said rotatable means for positioning said rotatable means relative to said removing means.

7. An apparatus for etching according to claim 1 wherein said first position of said means for delivering said modifying fluid is at said axis of rotation.

8. A method of modifying selected surface areas of a wafer comprising the steps of:
   Step 1, rotating a wafer having a surface to be modified about a vertical axis of rotation,
   Step 2, directing a stream of modifying fluid onto the surface of said rotating wafer such that said modifying fluid moves on said wafer surface away from said axis of rotation by centrifugal force, and
   Step 3, and removing said modifying fluid from said surface of said wafer at at least one predetermined location as said modifying fluid moves to said predetermined location.

9. A method of modifying selected surface areas of a wafer according to claim 8 wherein said surface to be modified is the surface of a semiconductor wafer and said modifying fluid is etching fluid.

10. A method of modifying selected surface areas of a wafer according to claim 8 wherein said surface to be modified is a layer of photoresist material on said wafer and said modifying fluid is a photoresist developer.

11. A method of modifying a wafer surface according to claim 8 further including the step of:
   changing the predetermined location wherein said modifying fluid is removed.

12. A method of modifying a wafer surface according to claim 8 further including the step of removing said modifying fluid from said surface of said wafer at a plurality of predetermined locations.

13. A method of modifying a wafer surface according to claim 8 further including the step of directory said steam of modifying fluid onto said surface of said rotating wafer at said axis of rotation.

* * * * *